(12) United States Patent
Shih et al.

(10) Patent No.: US 11,450,556 B2
(45) Date of Patent: Sep. 20, 2022

(54) SEMICONDUCTOR STRUCTURE

(71) Applicant: NANYA TECHNOLOGY CORPORATION, New Taipei (TW)

(72) Inventors: Shing-Yih Shih, New Taipei (TW); Chih-Ching Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 70 days.

(21) Appl. No.: 17/019,343

(22) Filed: Sep. 13, 2020

(65) Prior Publication Data
US 2020/0411367 A1 Dec. 31, 2020

Related U.S. Application Data

(62) Division of application No. 16/244,118, filed on Jan. 10, 2019, now Pat. No. 10,811,309.

(60) Provisional application No. 62/774,871, filed on Dec. 4, 2018.

(51) Int. Cl.
*H01L 21/768* (2006.01)
*H01L 23/522* (2006.01)
*H01L 21/311* (2006.01)
*H01L 23/528* (2006.01)

(52) U.S. Cl.
CPC .. *H01L 21/76804* (2013.01); *H01L 21/31144* (2013.01); *H01L 21/76877* (2013.01); *H01L 23/5226* (2013.01); *H01L 23/5283* (2013.01)

(58) Field of Classification Search
CPC ............... H01L 21/76804; H01L 21/31144
See application file for complete search history.

(56) References Cited

U.S. PATENT DOCUMENTS

| | | |
|---|---|---|
| 2002/0182857 A1 | 12/2002 | Liu et al. |
| 2007/0224835 A1 | 9/2007 | Iriguchi |
| 2007/0228432 A1 | 10/2007 | Ishihara et al. |
| 2020/0083185 A1* | 3/2020 | Cheng .............. H01L 21/32051 |

FOREIGN PATENT DOCUMENTS

TW 201727858 A 8/2017

* cited by examiner

*Primary Examiner* — Jasmine J Clark
(74) *Attorney, Agent, or Firm* — CKC & Partners Co., LLC

(57) ABSTRACT

A semiconductor structure includes a semiconductor device, an interconnect structure, a dielectric layer, and a redistribution layer (RDL). The interconnect structure is disposed over the semiconductor device. The dielectric layer is disposed over the interconnect structure. The RDL includes a conductive structure over the dielectric layer and a conductive via extending downwards from the conductive structure and through the dielectric layer. The conductive via includes a bottom portion, a top portion and a tapered portion between the bottom and top portions, in which the tapered portion has a width variation greater than that of the bottom and top portions.

6 Claims, 11 Drawing Sheets

SEMICONDUCTOR STRUCTURE

CROSS-REFERENCE TO RELATED APPLICATION

This application is a Divisional Application of the U.S. application Ser. No. 16/244,118, filed on Jan. 10, 2019, now U.S. Pat. No. 10,811,309, which claims priority of U.S. Provisional Application Ser. No. 62/774,871, filed on Dec. 4, 2018, the entirety of which is incorporated by reference herein in their entireties.

BACKGROUND

Technical Field

The present disclosure relates to a semiconductor structure and a method of forming the semiconductor structure. More particularly, the present disclosure relates to forming a redistribution layer (RDL) of a semiconductor structure, wherein the RDL has one or more conductive vias with a stepped profile.

Description of Related Art

With the rapid growth of electronic industry, the development of integrated circuits (ICs) is to achieve high performance and miniaturization. Technological advances in IC materials and design have produced generations of ICs where each generation has smaller and more complex circuits than the previous generation. As a result, via holes for a redistribution layer (RDL) of an IC are scaled down as well.

SUMMARY

According to some embodiments of the present disclosure, a semiconductor structure includes a semiconductor device, an interconnect structure, a dielectric layer, and a retribution layer. The interconnect structure is present over the semiconductor device. The dielectric layer is present over the interconnect structure. The RDL includes a conductive structure and a conductive via. The conductive structure is present over the dielectric layer. The conductive via extends downwards from the conductive structure and through the dielectric layer. The conductive via includes a bottom portion, a top portion and a tapered portion. The tapered portion is present between the bottom and top portions, wherein the tapered portion has a width variation greater than that of the bottom and top portions.

According to some embodiments of the present disclosure, the tapered portion tapers from the top portion to the bottom portion.

According to some embodiments of the present disclosure, the bottom portion is in contact with the interconnect structure.

According to some embodiments of the present disclosure, a width of the top portion is greater than a width of the bottom portion.

According to some embodiments of the present disclosure, the semiconductor structure further includes a protective layer over the RDL.

According to some embodiments of the present disclosure, the conductive structure is surrounded by the protective layer.

In summary, the disclosure provides a semiconductor structure and fabrication method. The conductive via hole includes the bottom portion, the tapered portion, and the top portion. Because the tapered portion and the top portion are wider than the bottom portion, the overhang problem can be avoided. Moreover, because the bottom portion is narrower than the tapered portion and the top portion, an improved via density can be achieved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
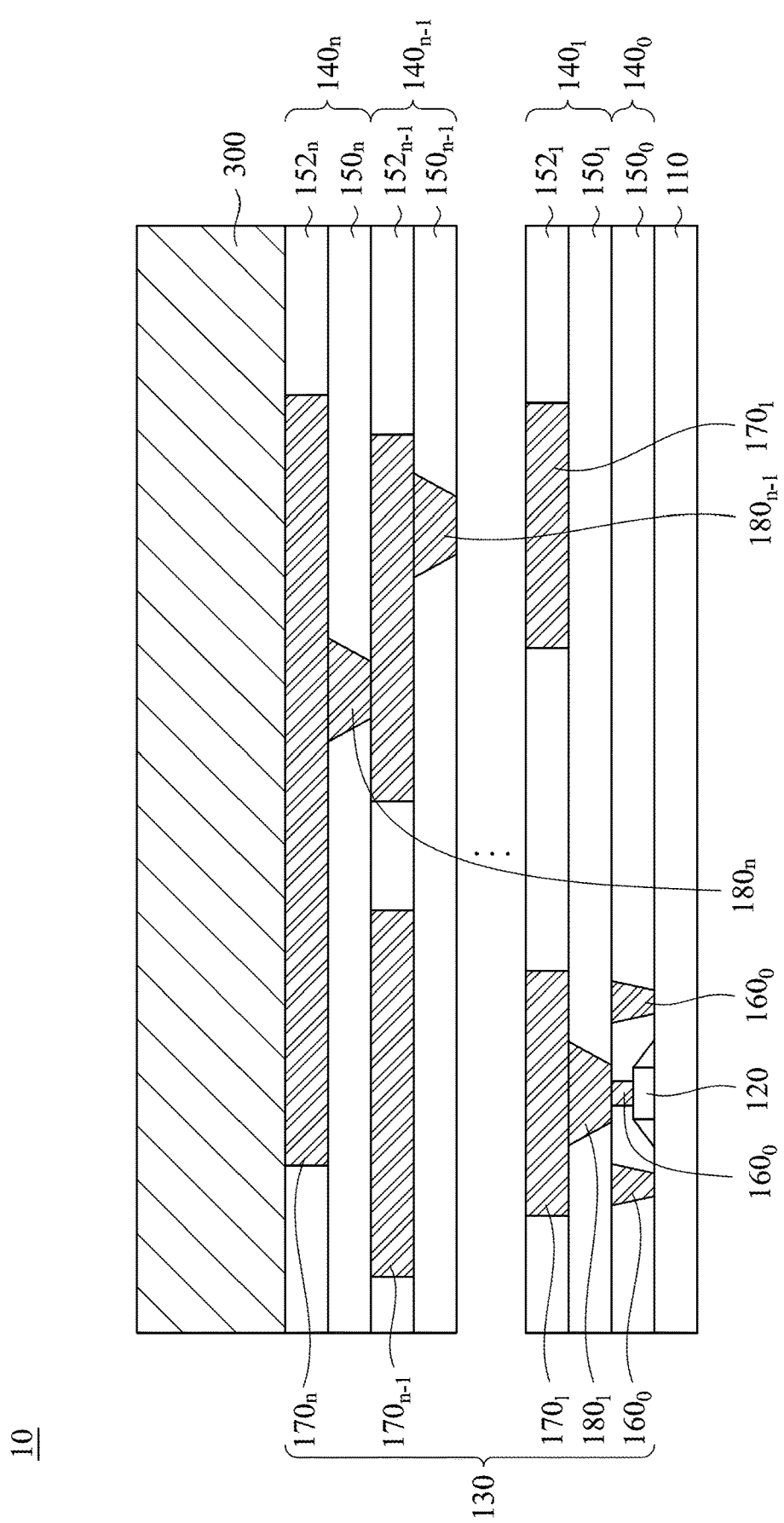
FIGS. 1 to 11 are cross-sectional views of a method of forming a semiconductor structure at various stages in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIGS. 1 to 11 are cross-sectional views of a method of forming a semiconductor structure 10 at various stages in accordance with some embodiments of the present disclosure. Referring to FIG. 1, a dielectric layer 300 is formed over an interconnect structure 130 that is formed over a substrate 110. In some embodiments, the substrate 110 may be a silicon substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor-on-insulator (SOI) such as having a buried layer.

In some embodiments, one or more active and/or passive devices 120 are formed on the substrate 110. The one or more active and/or passive devices 120 may include various N-type metal-oxide semiconductor (NMOS) and/or P-type metal-oxide semiconductor (PMOS) devices, such as transistors, capacitors, resistors, diodes, photo-diodes, fuses, and the like.

The interconnect structure 130 is formed over the one or more active and/or passive devices 120 and the substrate 110. The interconnect structure 130 electrically interconnects the one or more active and/or passive devices 120 to form functional electrical circuits within the semiconductor structure 10. The interconnect structure 130 may include one or more metallization layers $140_0$ to $140_n$, wherein n+1 is the number of the one or more metallization layers $140_0$ to $140_n$. In some embodiments, the value of n may vary in response to design specifications of the semiconductor structure 10. The metallization layers $140_0$ to $140_n$ may include dielectric layers $150_0$ to $150_n$, respectively. The metallization layers $140_1$ to $140_n$ may include dielectric layers $152_1$ to $152_n$, respectively. The dielectric layers $152_1$ to $152_n$ are formed over the corresponding dielectric layers $150_1$ to $150_n$.

In some embodiments, the dielectric layer $150_0$ can be referred to as an inter-layer dielectric (ILD) layer, and the dielectric layers $150_1$ to $150_n$ and dielectric layers $152_1$ to $152_n$ can be referred to as inter-metal dielectric (IMD) layers. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, the metallization layer $140_0$ may include conductive plugs $160_0$ through the dielectric layer $150_0$, and the metallization layers $140_1$ to $140_n$ comprise one or more conductive interconnects, such as conductive lines $170_1$ to $170_n$ respectively in dielectric layers $152_1$ to $152_n$, and conductive vias $180_1$ to $180_n$ respectively in dielectric layers $150_1$ to $150_n$. The conductive plugs $160_0$ electrically couple the one or more active and/or passive devices 120 to the conductive lines $170_1$ to $170_n$ and the conductive vias $180_1$ to $180_n$. In some embodiments where a device 120 is a transistor, the conductive plugs $160_0$ can be respectively land on a gate electrode, and source/drain regions of the transistor 120 and thus respectively serve as a gate contact, and source/drain contacts.

In some embodiments, the conductive plugs $160_0$, the conductive lines $170_1$ to $170_n$ and the conductive vias $180_1$ to $180_n$ may be formed using any suitable method, such as damascene, dual damascene, or the like. The conductive plugs $160_0$, the conductive lines $170_1$ to $170_n$ and the conductive vias $180_1$ to $180_n$ may comprise conductive materials such as copper, aluminum, tungsten, combinations thereof, or the like. In some embodiments, the conductive plugs $160_0$, the conductive lines $170_1$ to $170_n$, and the conductive vias $180_1$ to $180_n$ may further comprise one or more barrier/adhesion layers (not shown) to protect the respective dielectric layers $150_0$ to $150_n$ and $152_0$ to $152_n$ and from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like.

A dielectric layer 300 is blanket formed over the interconnect structure 130. In other words, the dielectric layer 300 is formed over the dielectric layer $152_n$ and the conductive line $170_n$. Stated differently, the dielectric layer 300 is in contact with a top surface of the conductive line $170_n$ as well as a top surface of the dielectric layer $152_n$. The method of forming the dielectric layer 300 may use, for example, PVD, CVD, ALD, or other suitable technique. In some embodiments, the dielectric layer 300 may include a single or multiple layers. The dielectric layer 300 may include silicon oxide, silicon nitride, silicon oxynitride, or other suitable materials.

Figure 2:
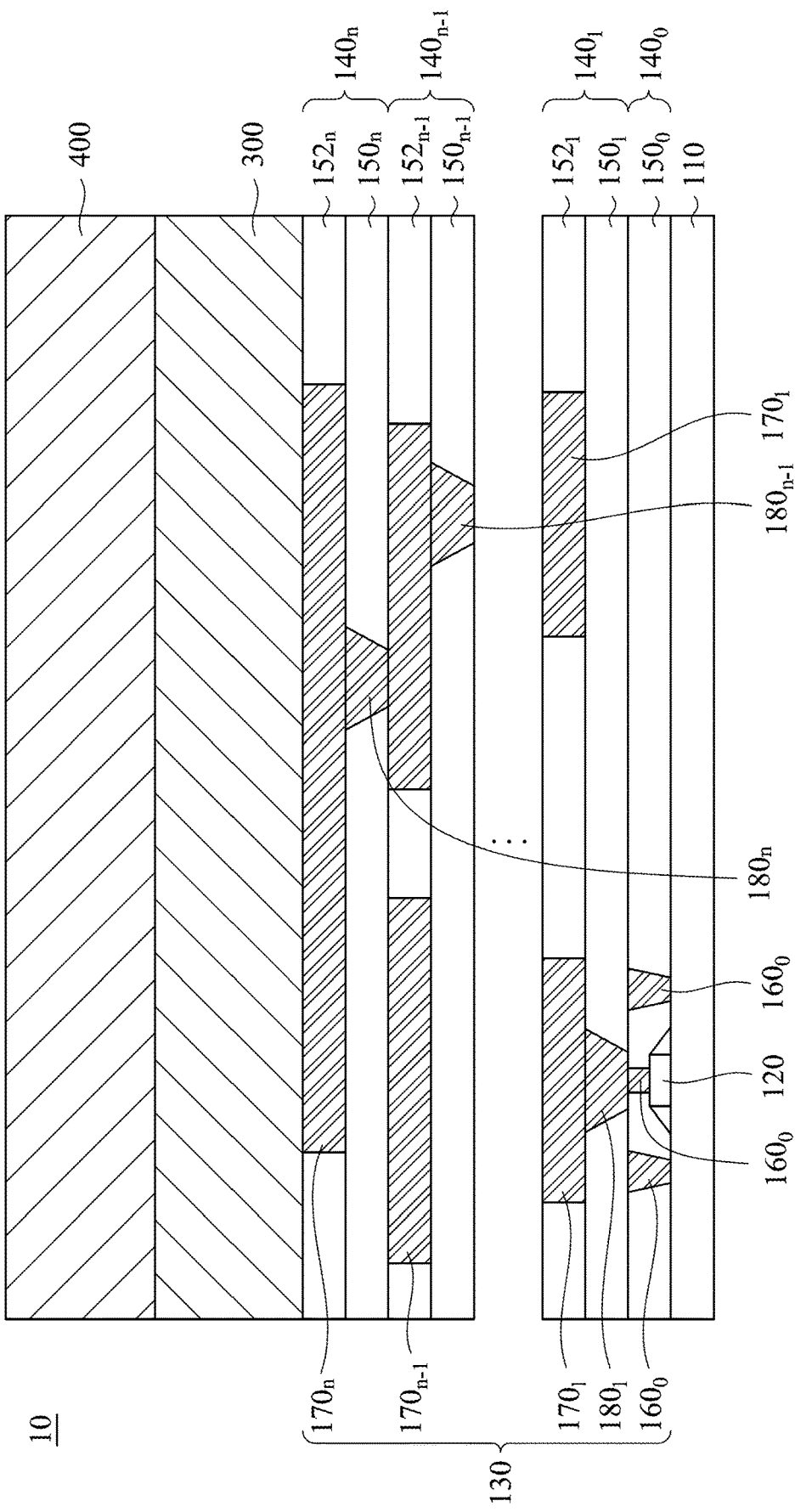

Referring to FIG. 2, a photoresist layer 400 is formed over the dielectric layer 300. The method of forming the photoresist layer 400 may use, for example, spin-on coating, or other suitable techniques. In some embodiments, the photoresist layer 400 may include an organic material, such as a spin-on carbon (SOC) material, or the like.

Figure 3:
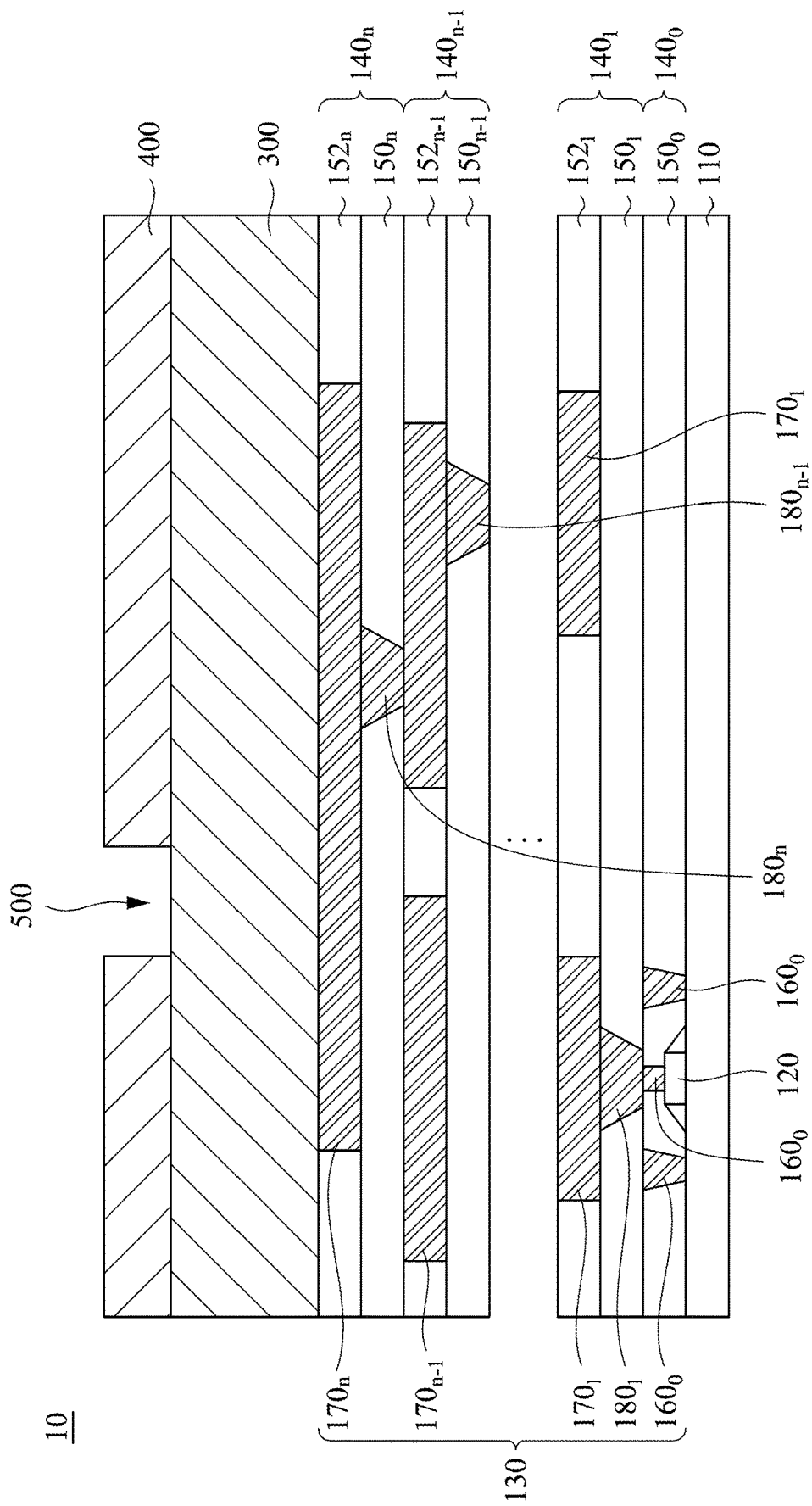

Referring to FIG. 3, the photoresist layer 400 is patterned by using suitable photolithography techniques. For example, after spin-on coating the photoresist layer 400 onto the dielectric layer 300, the photoresist layer 400 is exposed to a pattern of light radiation. Thereafter, the exposed photoresist layer 400 is developed in a developer such as an aqueous-based solution to produce a pattern including the opening 500 in the developed photoresist layer 400. As illustrated in FIG. 3, the patterned photoresist layer 400 has an opening 500 exposing the dielectric layer 300.

Figure 4:
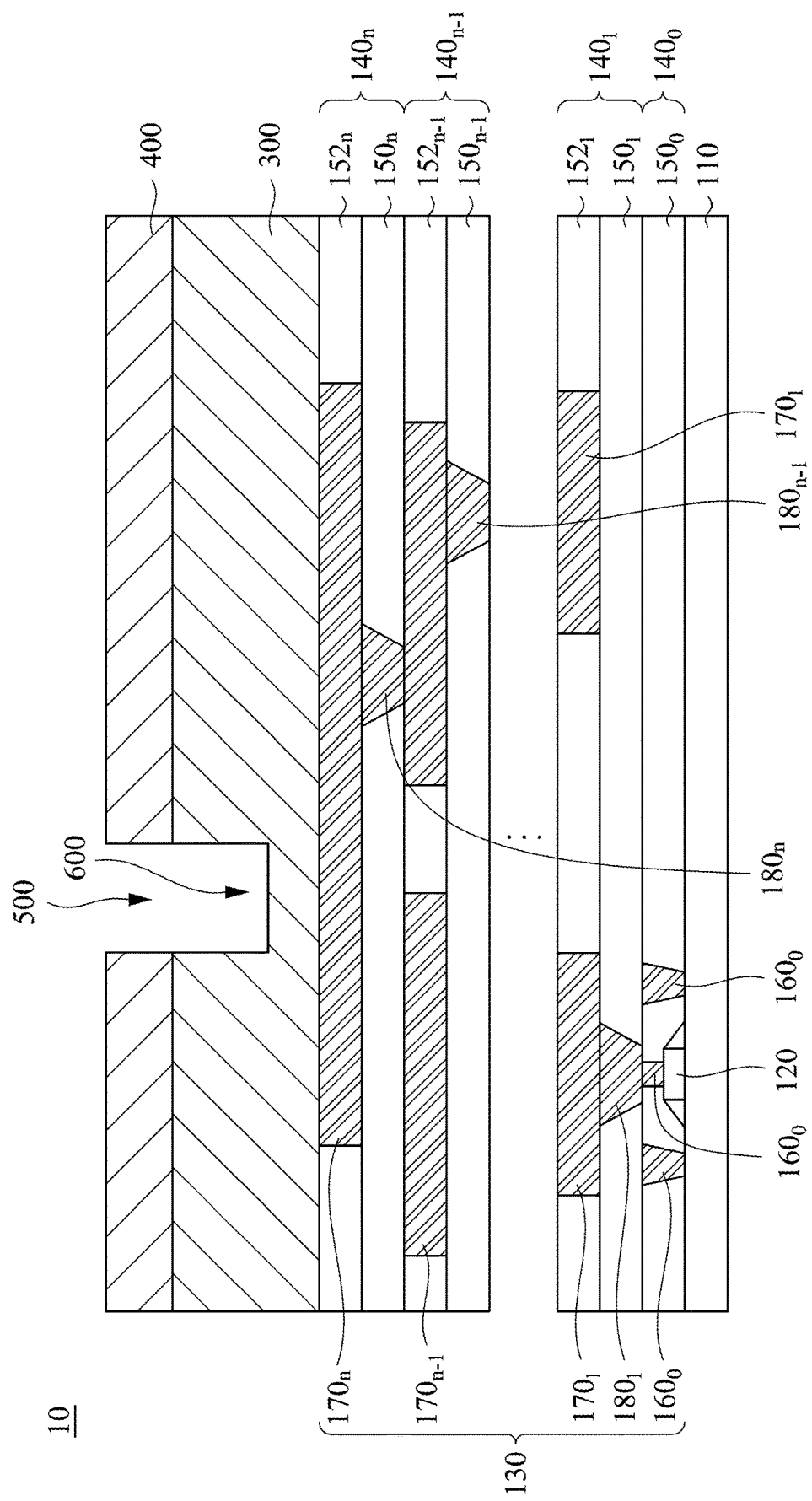

Referring to FIG. 4, the dielectric layer 300 is etched using the patterned photoresist layer 400 as an etch mask. This etching process results in a via hole 600 in the dielectric layer 300, and the via hole 600 has substantially the same top-view geometry (e.g., width or diameter) as the opening 500 in the patterned photoresist layer 400, because the etching process is performed using the patterned photoresist layer 400 as an etch mask. The etching process may include, for example, an anisotropic etching process using an etching has etch selectivity between the patterned photoresist layer 400 and the dielectric layer 300. Stated differently, the dielectric layer 300 has a higher etch rate in the etching process than that of the patterned photoresist layer 400, which in turn will result in formation of the via hole 600 in the dielectric layer 300 while keeping the sidewall of the opening 500 in the patterned photoresist layer 400 substantially intact. In this way, the pattern of opening 500 of the patterned photoresist layer 400 can be transferred to the underlying dielectric layer 300.

As shown in FIG. 4, etching the dielectric layer 300 stops before the conductive line $170_n$ is exposed, so that a portion of the dielectric layer 300 remains below the via hole 600. The via hole 600 is present below the opening 500. In other words, the portion of the dielectric layer 300 remains between the via hole 600 and the underlying dielectric layer 300. In some embodiments, the etching process is a time mode etching which is controlled to stop before the conductive line $170_n$ is exposed.

In some embodiments, the etching process may use either dry or wet etching. The dry etchant, e.g., $H_2$ and $N_2$, may be selected for dry etching process. The wet etchant, e.g., diluted HF acid, may be selected for wet etching process.

Figure 5:
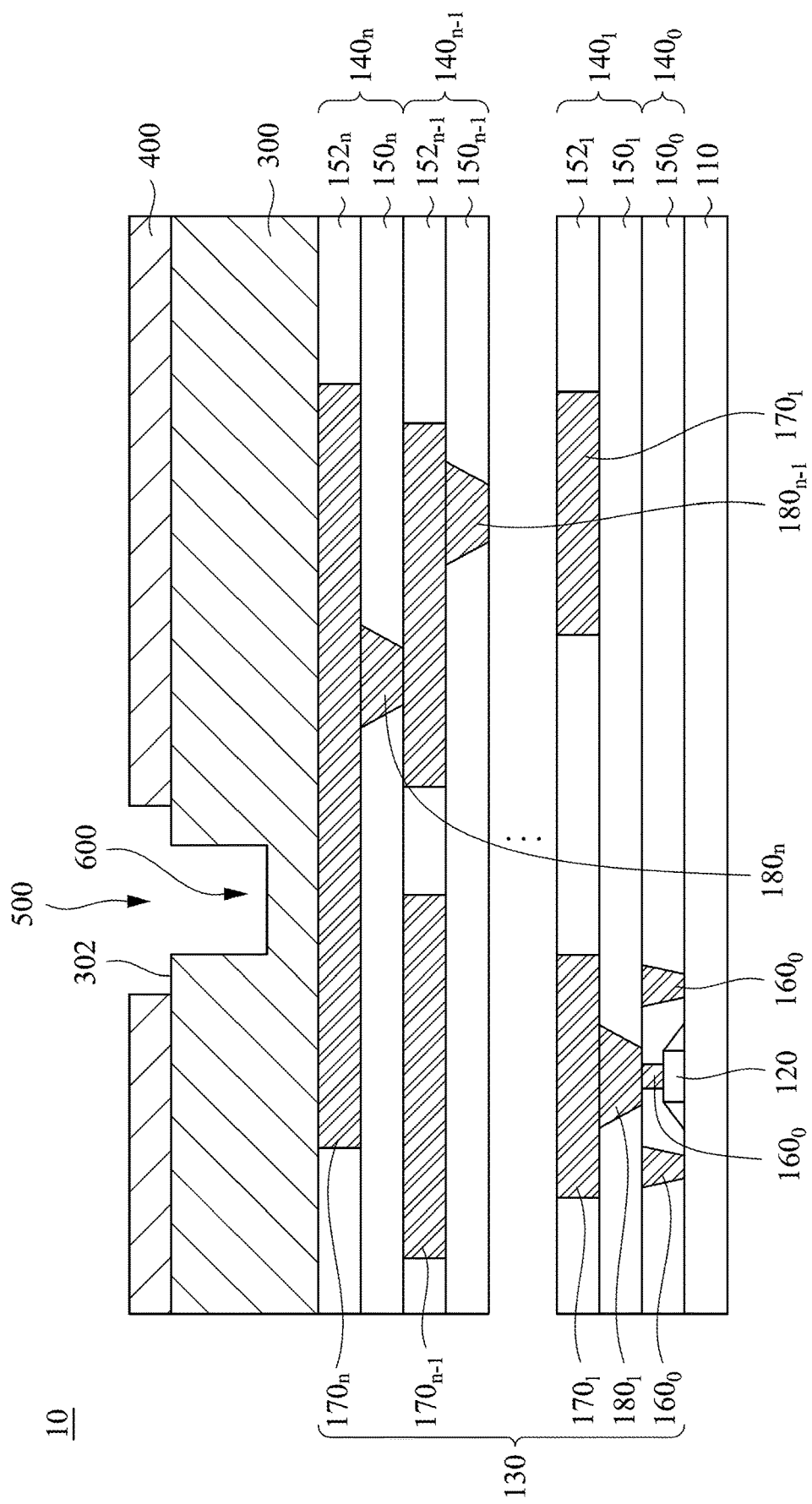

Referring to FIG. 5, the patterned photoresist layer 400 is trimmed in such a way that the opening 500 in the patterned photoresist layer is laterally expanded. Laterally expanding the opening 500 in the photoresist layer 400 results in exposure of a top surface of the dielectric layer 300, which in turn will facilitate to lateral expand the via hole 600 in the dielectric layer 300 in a following etching process. In some embodiments, trimming the patterned photoresist layer 400 also leads to thinning the patterned photoresist layer 400.

Trimming the photoresist layer 400 may include a selective etching process that has etching selectivity between the photoresist layer 400 and the dielectric layer 300. In greater detail, the photoresist layer 400 has a higher etch rate than that of the dielectric layer 300 during trimming the photoresist layer 400. In this way, the opening 500 in the photoresist layer 400 can be laterally expanded, while the via hole 600 remains substantially intact. The etchant used in the etching process as shown in FIG. 5 is different from the etchant used in the etch process as shown in FIG. 4, because the etchant used in the etch process performed in FIG. 4 etches the dielectric layer 300 faster than the photoresist layer 400, but the etchant used in the etch process as shown in FIG. 5 etches the photoresist layer 400 faster than the dielectric layer 300. In some embodiments, the etching process for trimming the patterned photoresist layer 400 uses etching process gases including, for example, $O_2$, $Cl_2$, HBr, He, $NF_3$, $CO_2$, $C_xH_yF_z$, Ar, $N_2$, $H_2$, the like, or a combination thereof.

In some embodiments, trimming the photoresist layer 400 is in-situ performed with the previous etching process of forming the via hole 600 (as shown in FIG. 4). Stated differently, the etching process of trimming the photoresist layer 400 and the etching process of forming the via hole 600 can be performed without vacuum break. For example, the etching process of trimming the photoresist layer 400 and the etching process of forming the via hole 600 can be performed in the same etching tool. Alternatively, trimming the photoresist layer 400 is ex-situ performed with the previous etching process of forming the via hole 600. For example, the etching process of trimming the photoresist layer 400 and the etching process of forming the via hole 600 can be performed in different etching tools.

Figure 6:
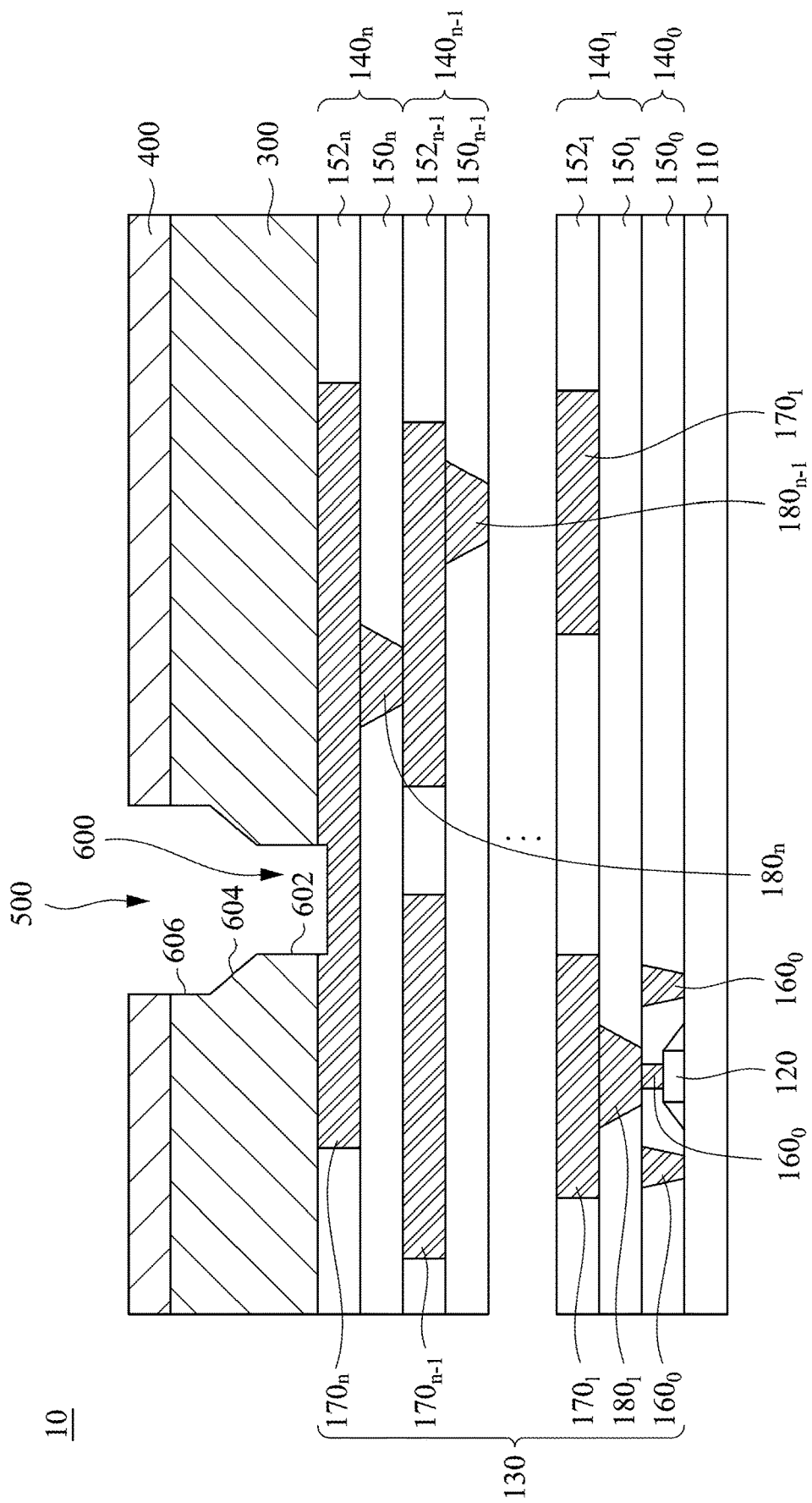

Referring to FIG. 6, the dielectric layer 300 is etched using the trimmed photoresist layer 400 as an etch mask. Because the trimmed photoresist layer 400 has an laterally expanded opening 500 exposing the top surface 302 of the dielectric layer 300, the etching process results in laterally expanding the via hole 600 in the dielectric layer 300. Moreover, the etching process also further deepens the via hole 600 until reaching the conductive line $170_n$. In greater detail, the etching process results in the via hole 600 having a bottom portion 602, a tapered portion 604 over the bottom portion 602, and a top portion 606 over the tapered portion 604. The tapered portion 604 tapers from the top portion 606 to the bottom portion 602. A width variation of the bottom portion 602 is less than that of the tapered portion 604, and a width variation of the top portion 606 is less than that of the tapered portion 604 as well. For example, the width of the bottom portion 602 is substantially unchanged, and the width of the top portion 606 is substantially unchanged as well. Because the tapered portion 604 and the top portion 606 is wider than the bottom portion 602, the tapered portion 604 and the top portion 606 can provide more space for following metal deposition, which in turn can mitigate the adverse impact resulting from overhang of following metal deposition. Moreover, because the bottom portion 602 is narrower than the tapered portion 604 and the top portion 606, an improved via density can be achieved. In some embodiments, the width of the via hole 600 (especially the width of the top portion 606 or the average width of the tapered portion 604) is from about 1 um to about 10 um.

In some embodiments, the etching process as shown in FIG. 6 may use the same etchant as the etching process as shown in FIG. 4. In greater detail, the etching process may include, for example, an anisotropic etching process using an etching has etch selectivity between the patterned photoresist layer 400 and the dielectric layer 300. Stated differently, the dielectric layer 300 has a higher etch rate in the etching process than that of the patterned photoresist layer 400, which in turn will result in expanding the via hole 600 in the dielectric layer 300 while keeping the sidewall of the opening 500 in the patterned photoresist layer 400 substantially intact. For example, the etching process may use either dry or wet etching. The dry etchant, e.g., $H_2$ and $N_2$, may be selected for dry etching process. The wet etchant, e.g., diluted HF acid, may be selected for wet etching process.

In some embodiments, expanding the via hole 600 in the dielectric layer 300 is in-situ performed with the previous etching process of trimming the photoresist layer 400 (as shown in FIG. 5). Stated differently, the etching process of expanding the via hole 600 and the etching process of trimming the photoresist layer 400 can be performed without vacuum break. For example, the etching process of expanding the via hole 600 and the etching process of trimming the photoresist layer 400 can be performed in the same etching tool. Alternatively, expanding the via hole 600 is ex-situ performed with the previous etching process of trimming the photoresist layer 400. For example, the etching process of expanding the via hole 600 and the etching process of trimming the photoresist layer 400 can be performed in different etching tools.

Figure 7:
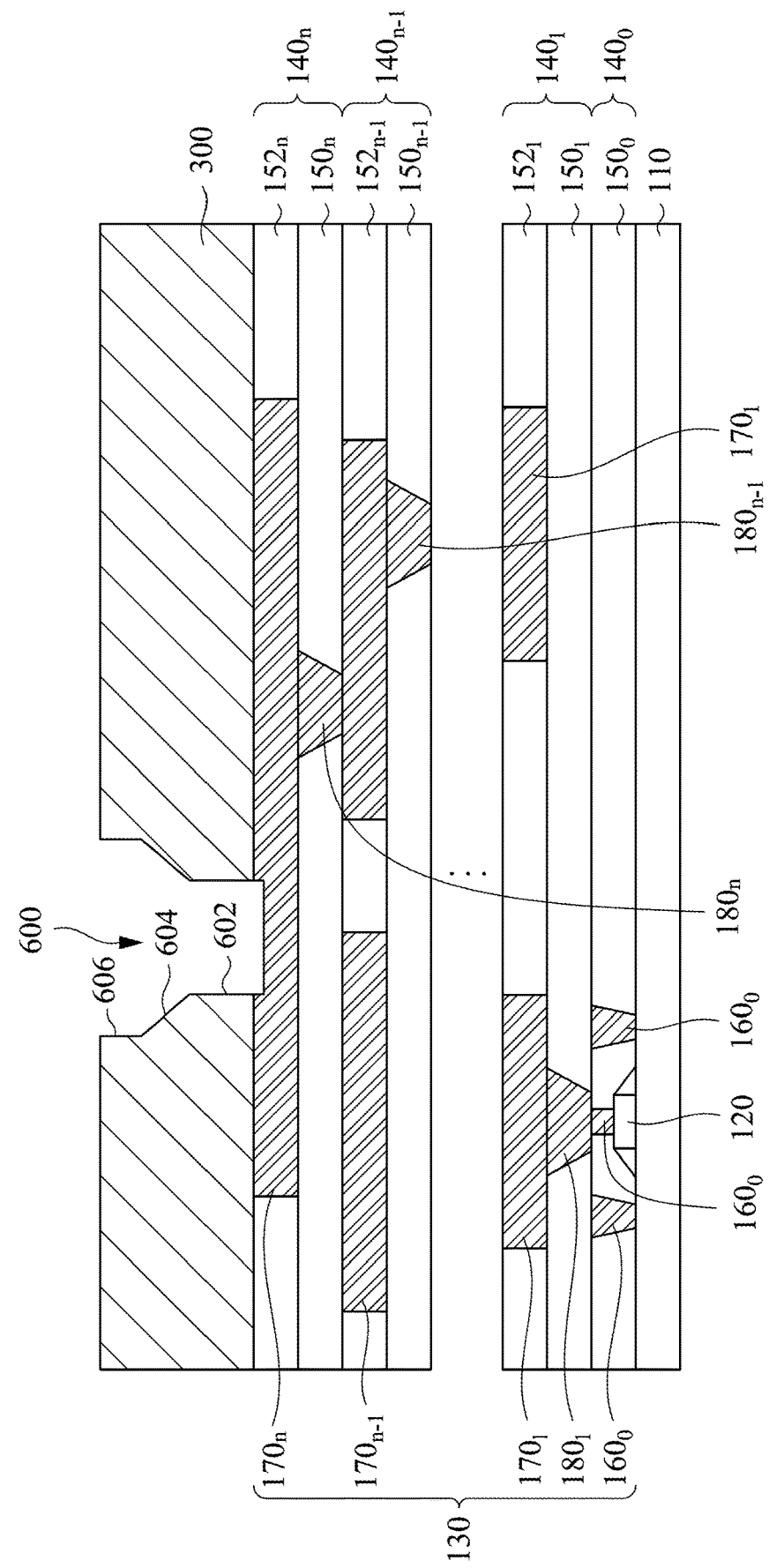

Referring to FIG. 7, the patterned photoresist layer 400 is removed. In some embodiments, removing the patterned photoresist layer 400 may be performed by using a photoresist strip process, such as an ashing process.

Figure 8:
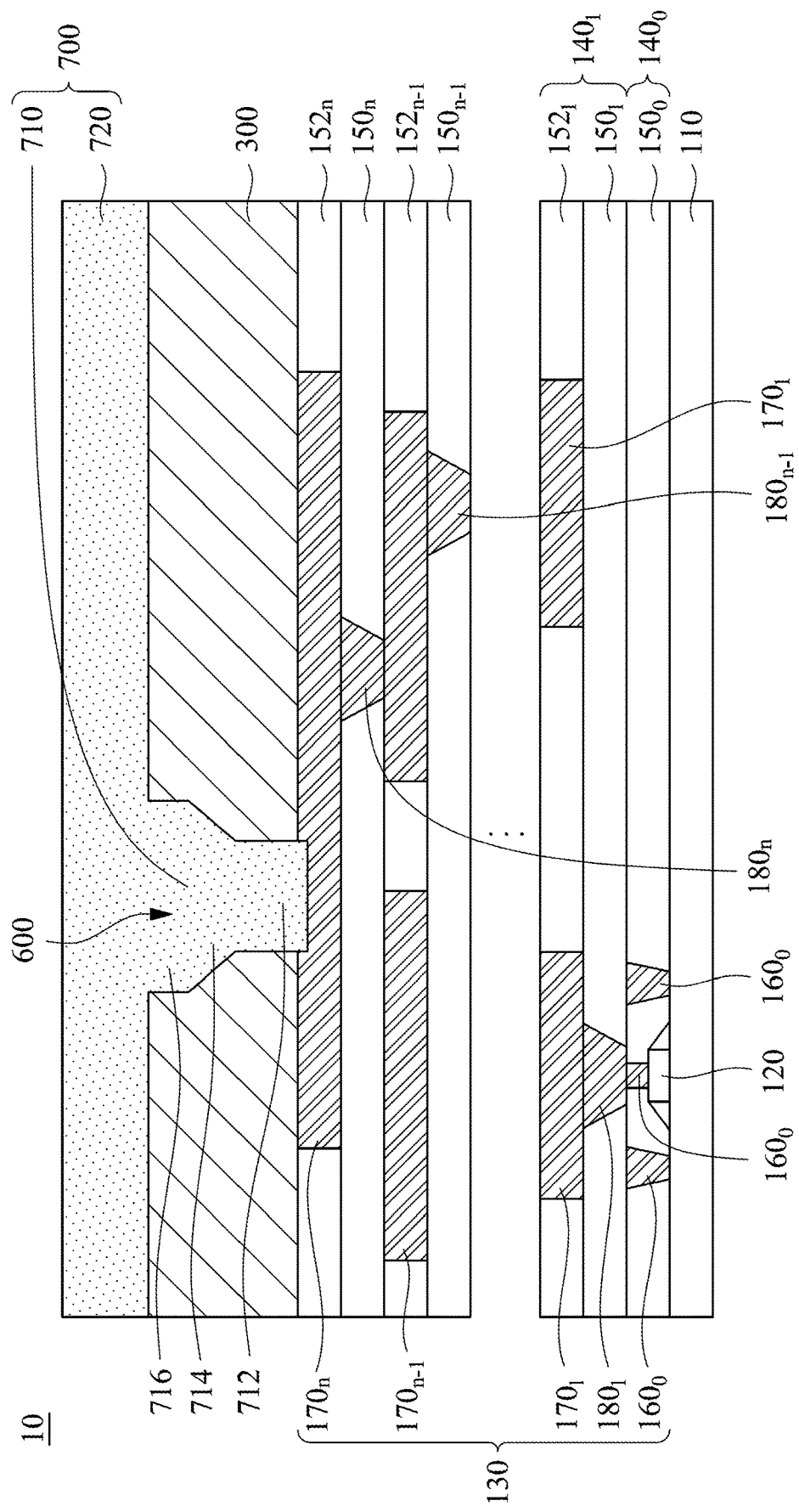

Referring to FIG. 8, a conductive layer 700 is formed on the dielectric layer 300. In the greater detail, the conductive layer 700 includes a conductive via 710 and a conductive structure 720. The conductive layer 700 covers the dielectric layer 300 and is filled into the expanded via hole 600 to form the conductive via 710 in the via hole 600. In some embodiments, the conductive layer 700 includes a metal or a metal alloy such as aluminum (Al), copper (Cu), other suitable conductive material, or combinations thereof. The conductive layer 700 may be formed by a PVD method such as sputtering method, or other suitable methods.

In the present embodiment, the conductive via 710 extends downwards from the conductive structure 720 and through the dielectric layer 300. Because the conductive via 710 fills the via hole 600, the conductive via 710 inherits the profile of the via hole 600. In greater detail, the conductive via 710 includes a bottom portion 712, a tapered portion 714, and a top portion 716 which correspond to the bottom portion 602, the tapered portion 604, and the top portion 606 of the via hole 600, respectively. The tapered portion 714 tapers from the top portion 716 to the bottom portion 712. A width variation of the bottom portion 712 is less than that of the tapered portion 714, and a width variation of the top portion 716 is less than that of the tapered portion 714 as well. For example, the width of the bottom portion 712 is substantially unchanged, and the width of the top portion 716 is substantially unchanged as well. In some embodiments, the width of the top portion 716 is greater than the width of the bottom width 712. The tapered portion 714 has a maximum width and a minimum width, in which the maximum width of the tapered portion 714 is substantially equal to the width of the top portion 716, and the minimum width of the tapered portion 714 is substantially equal to the width of the bottom portion 712.

In some embodiments, the bottom portion 712 is in contact with the conductive line $170_n$ of the interconnect structure 130. In some embodiments, the bottom portion 712 is embedded in the conductive line $170_n$ of the interconnect structure 130. In other words, a bottom surface of the conductive via 710 is below a top surface of the conductive line $170_n$ of the interconnect structure 130.

Figure 9:
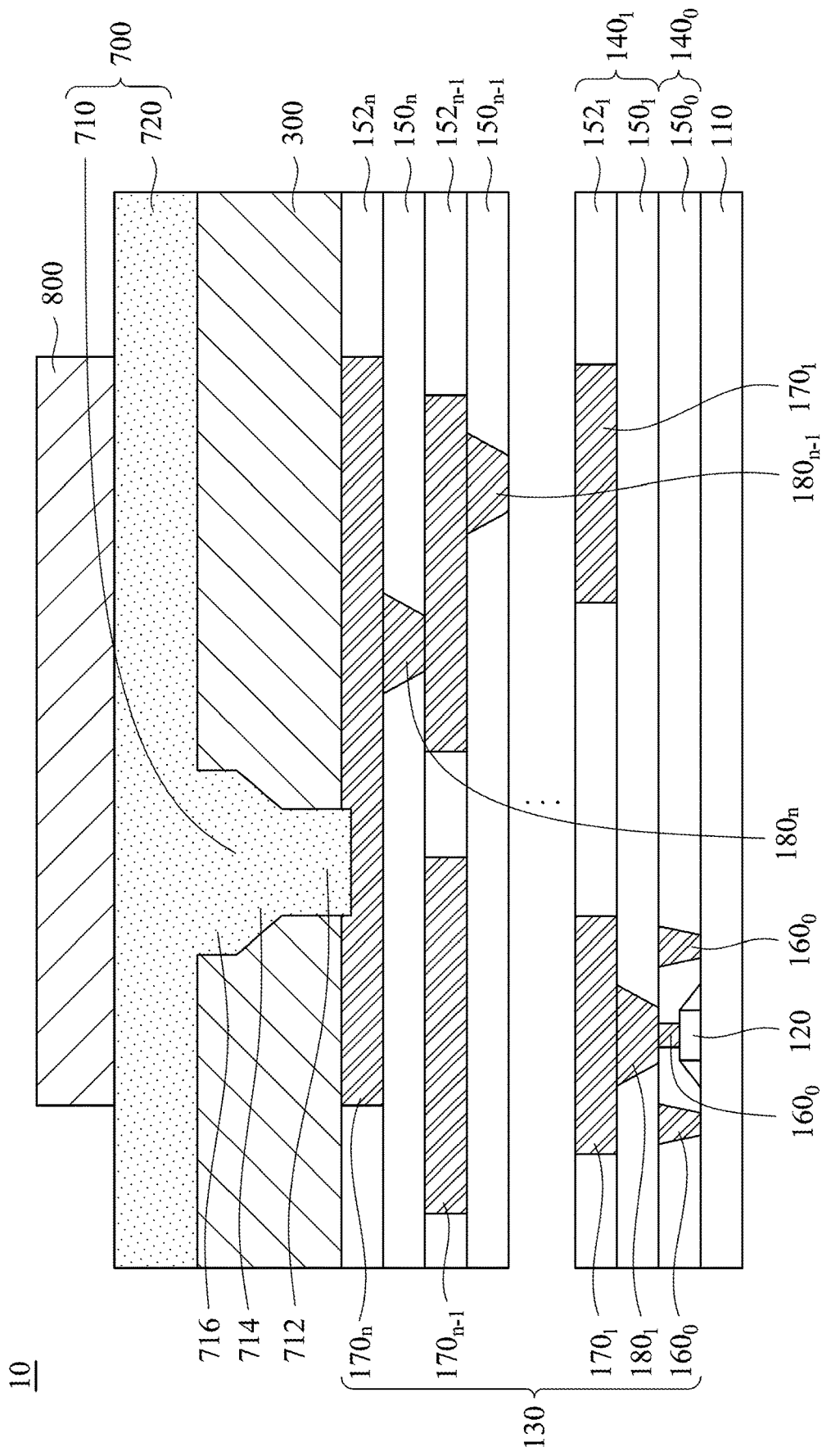

Referring to FIG. 9, a patterned mask layer 800 is formed over the conductive layer 700. The patterned mask layer 800 covers a portion of the conductive structure 720, while exposes the other portion of the conductive structure 720. In the present embodiment, the patterned mask layer 800 is a photoresist layer. The method of forming the patterned mask layer 800 may include first forming a photoresist layer and then patterning the photoresist layer with a photolithography process.

Figure 10:
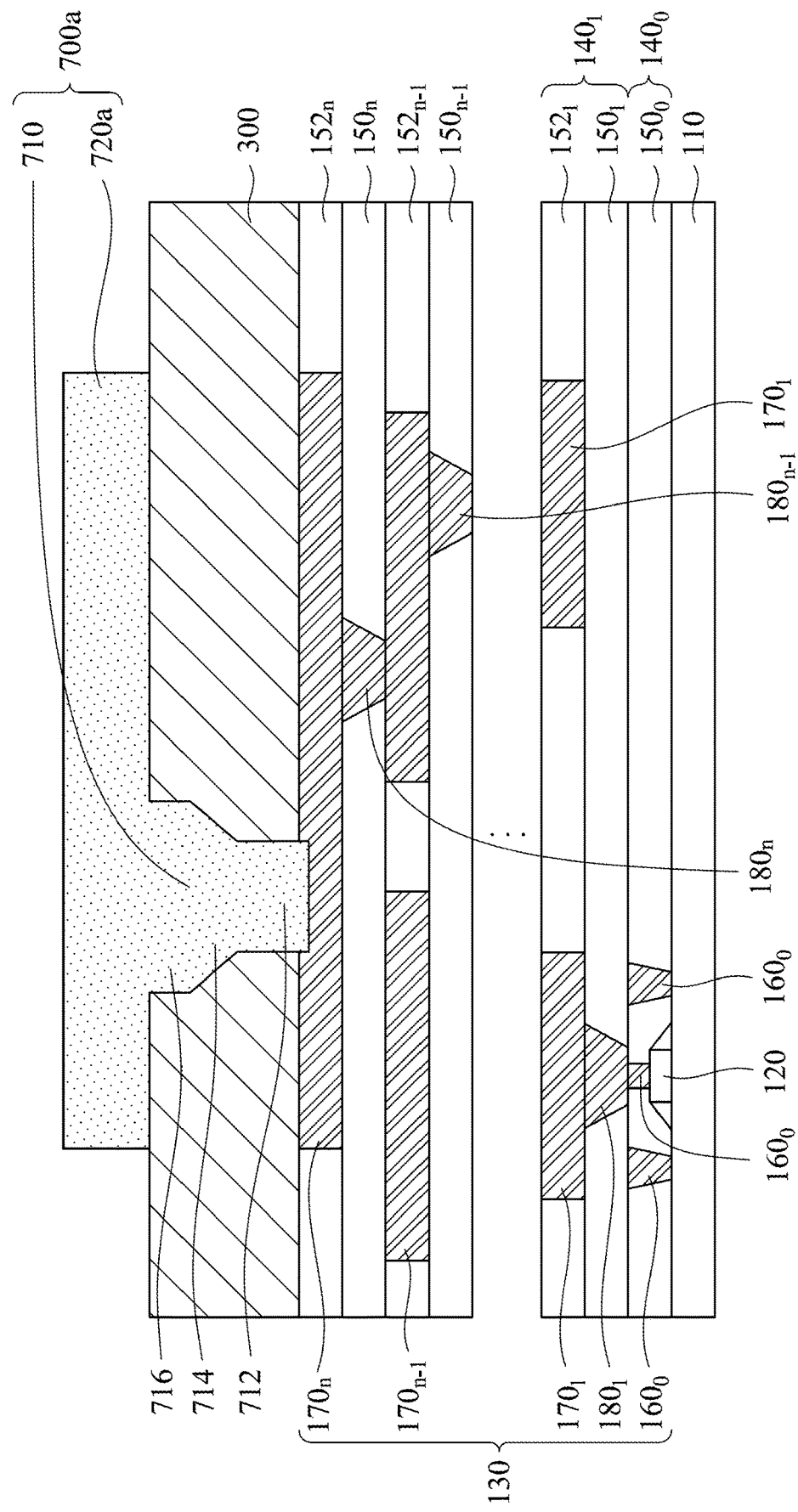

Afterwards, the conductive layer 700 is patterned using the patterned mask layer 800 as an etch mask, thus resulting in a redistribution layer (RDL) 700a. The resulting structure is shown in FIG. 10. After patterning the conductive layer 700 using suitable etching techniques, the patterned mask layer 800 is removed by, for example, an ashing process. As illustrated, the RDL 700a includes a conductive structure 720a and the conductive via 710. The conductive 720a covers the conductive via 710 and a portion of the dielectric layer 300, while exposes the other portion of the dielectric layer 300.

Figure 11:
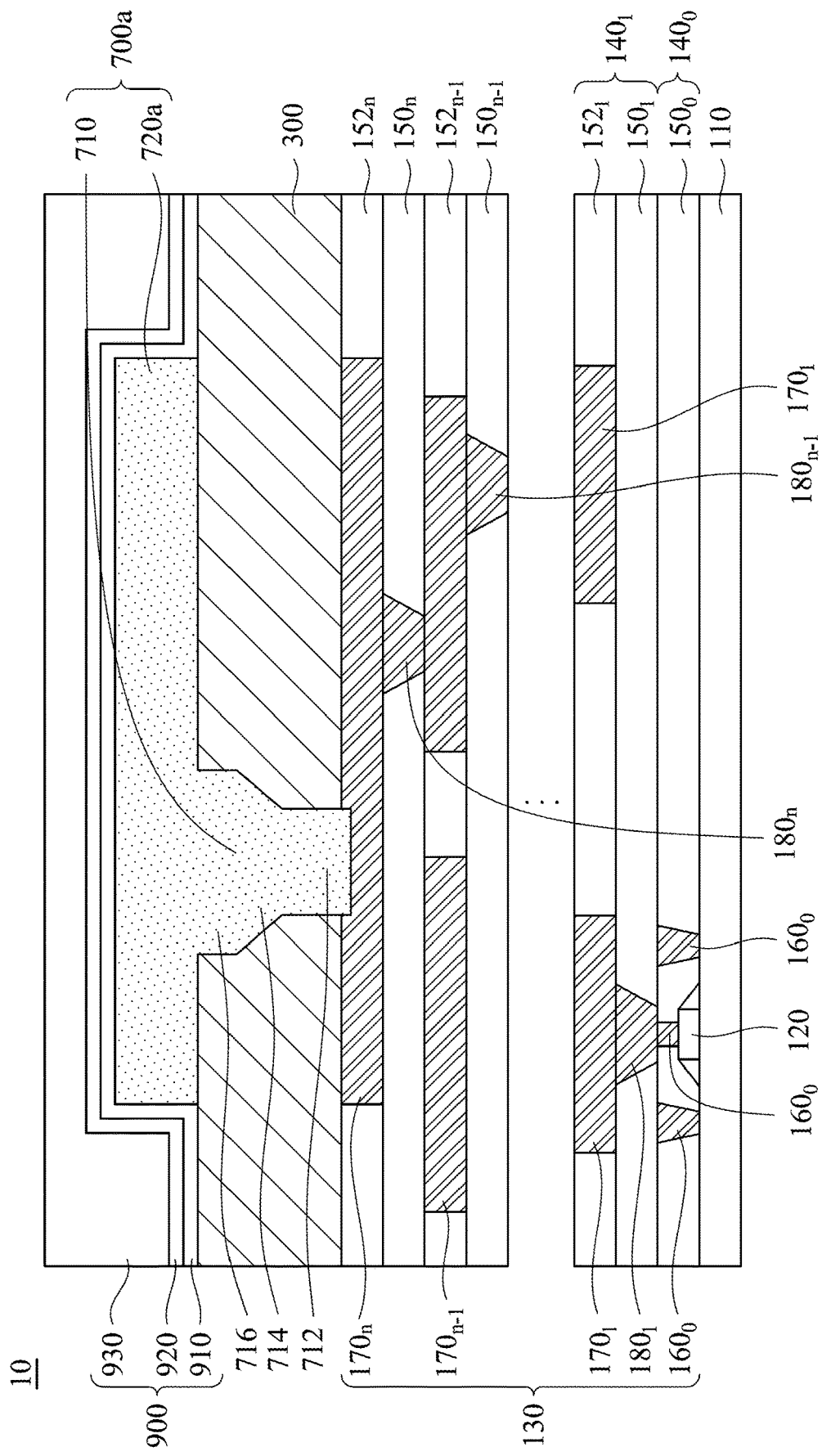

Referring to FIG. 11, a protective layer 900 is formed on the substrate 110 to cover the RDL 700a and the dielectric layer 300. In some embodiments, the protective layer 900 is a single, double, or multi-layer structure. The protective layer 900 may include silicon oxide, silicon, silicon oxynitride, silicon nitride, an organic material, a polymer or combinations thereof. The organic material is, for example, benzocyclobutene (BCB), and the polymer is, for example, polyimide (PI). The protective layer 900 may be formed by a CVD method, a coating method, or other suitable method. In the present embodiment, the protective layer 900 includes a silicon oxide layer 910, a silicon nitride layer 920, and a polyimide layer 930.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a semiconductor device;
   an interconnect structure over the semiconductor device;
   a dielectric layer over the interconnect structure; and
   a redistribution layer (RDL) comprising a conductive structure over the dielectric layer and a conductive via extending downwards from the conductive structure and through the dielectric layer, wherein the conductive via comprises a bottom portion, a top portion and a tapered portion between the bottom and top portions, wherein the tapered portion has a width variation greater than that of the bottom and top portions.

2. The semiconductor structure of claim 1, wherein the tapered portion tapers from the top portion to the bottom portion.

3. The semiconductor structure of claim 1, wherein the bottom portion is in contact with the interconnect structure.

4. The semiconductor structure of claim 1, wherein a width of the top portion is greater than a width of the bottom portion.

5. The semiconductor structure of claim 1, further comprising:
   a protective layer over the RDL.

6. The semiconductor structure of claim 5, wherein the conductive structure is surrounded by the protective layer.

* * * * *